US010923527B2

(12) United States Patent
Chen et al.

(10) Patent No.: US 10,923,527 B2
(45) Date of Patent: Feb. 16, 2021

(54) MICRO LIGHT-EMITTING DIODE DISPLAY PANEL HAVING CONTROL ELEMENT FOR CONTROLLING MULTIPLE MICRO LIGHT-EMITTING DIODES EMITTING THE SAME COLOR

(71) Applicant: PIXELED DISPLAY CO., LTD., Zhubei (TW)

(72) Inventors: Pei-Hsin Chen, Zhubei (TW); Yi-Chun Shih, Zhubei (TW); Yi-Ching Chen, Zhubei (TW); Ying-Tsang Liu, Zhubei (TW); Yu-Chu Li, Zhubei (TW); Tzu-Yang Lin, Zhubei (TW); Yu-Hung Lai, Zhubei (TW)

(73) Assignee: PixeLED Display CO., LTD., Hsinchu County (TW)

( * ) Notice: Subject to any disclaimer, the term of this patent is extended or adjusted under 35 U.S.C. 154(b) by 35 days.

(21) Appl. No.: 16/209,472

(22) Filed: Dec. 4, 2018

(65) Prior Publication Data
US 2020/0035749 A1    Jan. 30, 2020

(30) Foreign Application Priority Data

Jul. 25, 2018 (TW) .............................. 107125676 A

(51) Int. Cl.
| *H01L 27/15* | (2006.01) |
| *G09G 3/32* | (2016.01) |
| *G09G 3/20* | (2006.01) |
| *H05B 33/08* | (2020.01) |
| *H05B 45/20* | (2020.01) |
| *G09F 9/30* | (2006.01) |

(52) U.S. Cl.
CPC ......... *H01L 27/156* (2013.01); *G09G 3/2003* (2013.01); *G09G 3/32* (2013.01); *H05B 45/20* (2020.01); *G09F 9/301* (2013.01)

(58) Field of Classification Search
CPC .... H01L 27/156; H05B 45/20; G09G 3/2003; G09G 3/32; G09G 2300/0426; G09G 2300/0804; G09F 9/301
See application file for complete search history.

(56) References Cited

U.S. PATENT DOCUMENTS

| 9,472,734 B1* | 10/2016 | Chen ..................... H01L 33/505 |
| 2014/0159064 A1* | 6/2014 | Sakariya ............. H01L 25/0753 |
| | | 257/88 |
| 2017/0010706 A1* | 1/2017 | Cok ........................ G06F 3/044 |

(Continued)

*Primary Examiner* — Kwang-Su Yang
(74) *Attorney, Agent, or Firm* — JCIPRNET

(57) ABSTRACT

A micro LED display panel includes a display area, a plurality of micro light-emitting elements and a plurality of micro control elements. The plurality of micro light-emitting elements is disposed in the display area and include a plurality of first color micro LEDs and a plurality of second color micro LEDs. A light wavelength of each of the first color micro LEDs is different from a light wavelength of each of the second color micro LEDs. The plurality of micro control elements is disposed in the display area, and include a plurality of first color micro circuit-chips and a plurality of second color micro circuit-chips. The plurality of first color micro circuit-chips control the plurality of first color micro LEDs, and the plurality of second color micro circuit-chips control the plurality of second color micro LEDs.

12 Claims, 11 Drawing Sheets

(56) References Cited

U.S. PATENT DOCUMENTS

| | | | | |
|---|---|---|---|---|
| 2017/0338211 A1* | 11/2017 | Lin | ......................... | H01L 33/62 |
| 2018/0197885 A1* | 7/2018 | Lee | ..................... | H01L 27/1251 |
| 2019/0305073 A1* | 10/2019 | Chen | ................... | H01L 51/0097 |
| 2019/0353953 A1* | 11/2019 | Nieh | ................. | G02F 1/133305 |
| 2019/0363127 A1* | 11/2019 | Wu | ........................... | G09F 9/33 |
| 2020/0020676 A1* | 1/2020 | Cok | .................... | H01L 25/0753 |

* cited by examiner

MICRO LIGHT-EMITTING DIODE DISPLAY PANEL HAVING CONTROL ELEMENT FOR CONTROLLING MULTIPLE MICRO LIGHT-EMITTING DIODES EMITTING THE SAME COLOR

CROSS-REFERENCE TO RELATED APPLICATIONS

This non-provisional application claims priority under 35 U.S.C. § 119(a) on Patent Application No(s). 107125676 filed in Taiwan, R.O.C. on Jul. 25, 2018, the entire contents of which are hereby incorporated by reference.

TECHNICAL FIELD

The disclosure relates to a display panel, more particularly to a display panel having micro light-emitting elements.

BACKGROUND

Display technologies develop rapidly due to demands of customers for qualities and performance. In the early stage, thin film transistor displays with non-self-luminous features were considered as main products by various manufacturers. With applications of LEDs and defects of conventional TFT LCDs, organic LED displays with self-luminous features are developed, which has brought up a significant influence to the industry of displays.

A new generation of micro LED displays has become a newly emerging technology recently due to the base of long-term development of LCDs as well as wide applications of LEDs. However, there are some technical problems existing in the process of micro LEDs manufacturing. For example, display qualities of micro LEDs cannot be satisfied due to the problems of electron mobility and uniformity. Therefore, it has become an important issue to improve the display qualities in the field.

SUMMARY

A micro light-emitting diode display panel is disclosed in the present disclosure. In the micro light-emitting diode display panel, semiconductor circuit elements are arranged in proper display areas and used for controlling light-emitting diodes respectively to emit respective color lights. Thereby, the display quality and performance of the display panel could be improved.

A micro light-emitting diode display panel is disclosed according to one embodiment of the present disclosure. The micro light-emitting diode display panel comprises a display area, a plurality of micro light-emitting elements and a plurality of micro control elements. The plurality of micro light-emitting elements are disposed in the display area and include a plurality of first color micro light-emitting diodes and a plurality of second color micro light-emitting diodes. A light wavelength of each of the plurality of first color micro light-emitting diodes is different from a light wavelength of each of the plurality of second color micro light-emitting diodes. The plurality of micro control elements are disposed in the display area and include a plurality of first color micro circuit-chips and a plurality of second color micro circuit-chips. The plurality of first color micro circuit-chips are electrically connected to and control the plurality of first color micro light-emitting diodes, and the plurality of second color micro circuit-chips are electrically connected to and control the plurality of second color micro light-emitting diodes.

A micro light-emitting diode display panel is disclosed according to another embodiment of the present disclosure. The micro light-emitting diode display panel includes a display area, a plurality of micro light-emitting diodes, a plurality of micro control elements, a non-display area and at least one control element. The plurality of micro light-emitting diodes and a plurality of micro control elements are disposed in the display area. Each of the plurality of micro control elements is electrically connected to and controls a part of the plurality of micro light-emitting diodes. The non-display area is next to the display area. The at least one control element is disposed in the non-display area, and the at least one control element is electrically connected to and controls another part of the plurality of micro light-emitting diodes. The number of the micro light-emitting diodes controlled by at least one the control element is greater than the number of the micro light-emitting diodes controlled by each of the plurality of micro control elements.

BRIEF DESCRIPTION OF THE DRAWINGS

The present disclosure will become more fully understood from the detailed description given hereinbelow and the accompanying drawings which are given by way of illustration only and thus are not limitative of the present disclosure and wherein.

DETAILED DESCRIPTION

Figure 1:
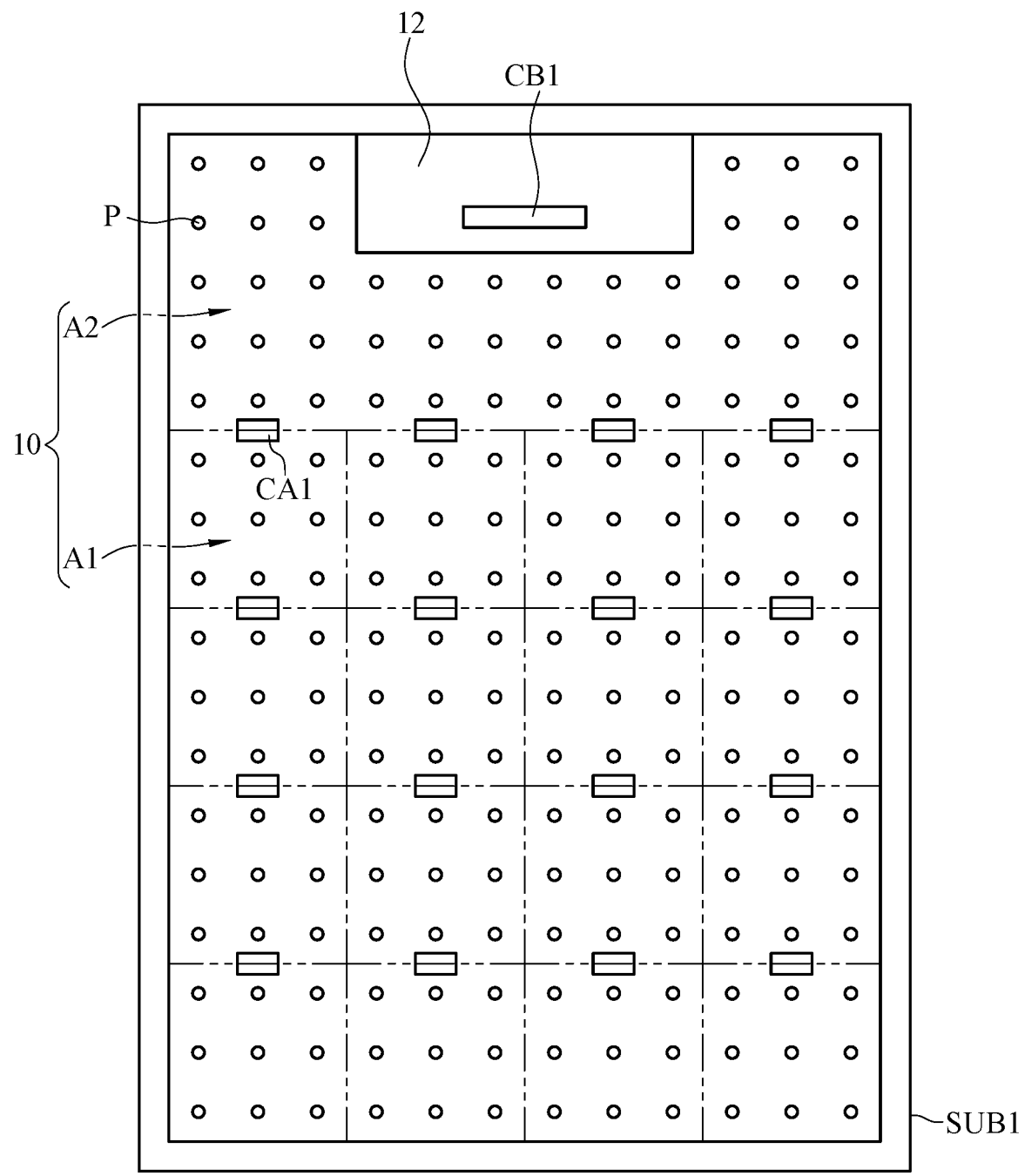
FIG. 1 is a diagram of a micro light-emitting diode display panel according to one embodiment of the present disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Please refer to FIG. 1, which is a diagram of a micro light-emitting diode display panel according to one embodiment of the present disclosure. As shown in FIG. 1, a micro light-emitting diode display panel 1 includes a display area 10, a non-display area 12, a plurality of micro light-emitting diodes P, a plurality of micro control elements CA1 and a control element CB1. The plurality of micro light-emitting diodes P and the plurality of micro control elements CA1 are all disposed in the display area 10. In practice, the micro light-emitting diode display panel 1 has a substrate SUB1, and the micro control elements CA1 and the light-emitting diodes P are all disposed on the same side of the substrate SUB1. In the embodiment of the present disclosure, for the purpose of simplification for drawings, only one single micro control element CA1 and one single micro light-emitting diode P are labeled as representations instead of labeling all of micro control elements and light-emitting diodes.

Each micro control element CA1 is electrically connected to a part of the micro light-emitting diodes P. A non-display area 12 is next to the display area 10. The control element CB1 is disposed in the non-display area 12, and the control element CB1 is electrically connected to and controls another part of the micro light-emitting diodes P. In other words, each one micro light-emitting diode P is only connected to one of the micro control elements CA1 or the control element CB1. In this embodiment, the non-display area 12 is located on a side of the display area 10, and the number of the micro light-emitting diodes P controlled by the control element CB1 is greater than the number of the micro light-emitting diodes P controlled by each of the plurality of micro control elements CA1. More particularly, the display area 10 can be non-rectangular, and can be designed in any kind of shapes according to actual demands. For example, the display area 10 could be manufactured for a vehicle dashboard, a rounded watch surface, etc. By taking the advantages of the control element CB1 having more pins, it is possible to integrate the number of the micro light-emitting diodes P disposed asymmetrically on the edges.

More specifically, the display area 10 is divided into a plurality of sub-display areas A1 and a sub-display area A2. Each micro control element CA1 correspondingly controls the micro light-emitting diodes P in a respective sub-display area A1 while the control element CB1 correspondingly controls the micro light-emitting diodes P in the sub-display area A2. The sub-display area A2, next to the non-display area 12, is larger than each sub-display area A1. In other words, the number of the micro light-emitting diodes P disposed in the sub-display area A2 is greater than the number of the micro light-emitting diodes P disposed in each sub-display area A1. By disposing the control element CB1 in the non-display area 12 to control more micro light-emitting diodes P in the sub-display area A2, the number of the micro control elements CA1 used in the micro light-emitting diode display panel 1 is decreased. Accordingly, the display quality is improved and the costs for arranging control circuits are reduced.

In this embodiment, the substrate SUB1 is a glass substrate with wires but without driving electrical components (e.g. thin film transistors) to drive the micro light-emitting diodes P. The micro control elements CA1 and the control element CB1 are driving circuit-chips which control the micro light-emitting diodes P, but the size and the number of pins of the control element CB1 are greater than the size and the number of pins of each micro control element CA1. More specifically, the micro light-emitting diodes P and the micro control elements CA1 are connected to the display area 10 of the substrate SUB1 and electrically connected to the wires (not shown in figures) via a mass transfer, the micro control elements CA1 and the control element CB1 control luminance of the micro light-emitting diodes P through wire connections. In other embodiment, the substrate SUB1 is a transparent substrate, a flexible substrate or a silicon substrate, or even a multi-layer board. The substrate SUB1 may also include electrical components such as thin film transistors, metal-oxide-semiconductor field effect transistors, resistors or capacitors, etc.

In the embodiment of the present disclosure, a "micro" light-emitting diode P has the size of 1 μm to 100 μm. In some embodiment, the micro light-emitting diode P has the maximum width of 20 μm, 10 μm or 5 μm, and has the maximum height less than 20 μm. It should be understood that embodiments of the present disclosure are not limited to the aforementioned embodiment. In some embodiments of the present disclosure, the micro light-emitting diode P having a relatively larger or smaller size may be applied. The micro control element CA1 is a "micro" circuit chip (micro IC) such as a microchip consisting of Si or SOI wafers and applied for driving, logic or memory, or a microchip consisting of GaAs wafers and applied for RF communication. The microchip has the size of 100 μm to 500 μm. For example, the microchip has the maximum length of 300 μm to 400 μm, and has the maximum height less than 200 μm. The control element CB1 has the same property as the micro control elements CA1. The size and the number of pins of the control element CB1 are greater than the size and the number of pins of each of the micro control elements CA1.

Figure 2:
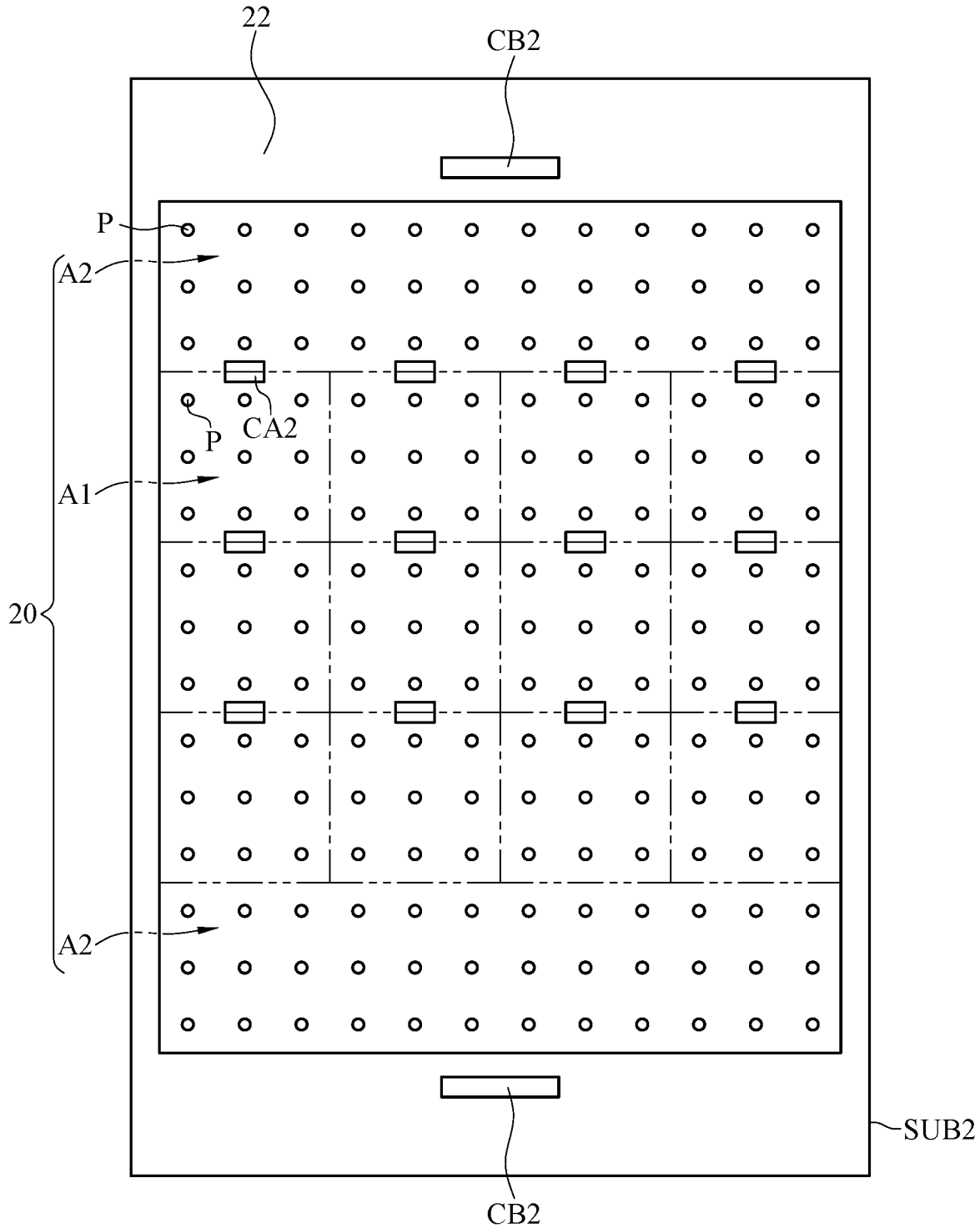
FIG. 2 is a diagram of a micro light-emitting diode display panel according to another embodiment of the present disclosure.

Please refer to FIG. 2, which is a diagram of a micro light-emitting diode display panel according to another embodiment of the present disclosure. The micro light-emitting diode display panel 2 includes a display area 20, a non-display area 22 surrounding to the display area 20, a plurality of micro light-emitting diodes P, a plurality of micro control elements CA2 and two control elements CB2. The display area 20 is divided into a plurality of sub-display areas A1 and two sub-display areas A2. The plurality of micro light-emitting diodes P and the plurality of micro control elements CA2 are all disposed on the display area 20. In practice, the micro light-emitting diode display panel 2 has a substrate SUB2, and the micro control elements CA2, the micro light-emitting diodes P and the control elements CB2 are all disposed on the same side of the substrate SUB2. Each micro control element CA2 is electrically connected to and controls a part of the micro light-emitting diodes P. The control elements CB2 are disposed in the non-display area 22. The control elements CB2 are electrically connected to and controls another part of the micro light-emitting diodes P.

The micro light-emitting diode display panel 2 is similar to the micro light-emitting diode display panel 1 shown in FIG. 1. The difference lies in that the non-display area 22 of the micro light-emitting diode display panel 2 in the embodiment surrounds the display area 20 and has two control elements CB2 disposed on the two opposite sides near the display area 20. In other words, two larger sub-display areas A2 are respectively arranged in two sides within the display area 20. Each of the control elements CB1 controls the micro light-emitting diodes P located on the respective one of the sub-display areas A2 while each of the micro control elements CA2 controls the micro light-emitting diodes P located on the respective one of the sub-display areas A1. Similar to the embodiment of FIG. 1, the number of the micro light-emitting diodes P controlled by each of the control elements CB2 is greater than the number of the micro light-emitting diodes P controlled by each of the micro control elements CA2. In other words, each of the sub-display areas A2 is greater than each of the sub-display areas A1. For the purpose of simplification for drawings, only one single micro light-emitting diode is labeled with "P" as representation instead of labeling all of the micro light-emitting diodes, and only one single micro control element is labeled with "CA2" instead of labeling all of the micro control elements. The same way of simplification for drawings is applied to the following embodiments. In this embodiment, the number of the micro light-emitting diodes P is merely for illustration, and the number of the micro light-emitting diodes P of the present disclosure is not limited to the above embodiment.

In the embodiment, the size and the number of pins of each control element CB2 are greater than the size and the number of pins of each micro control element CA2. In such arrangement, the display quality of the micro light-emitting diode display panel 2 can be improved. By disposing the control elements CB2 with larger sizes in the non-display area 22 to respectively control more micro light-emitting diodes P in the sub-display areas A2, the number of the micro control elements CA2 disposed in the display area 20 can be reduced, and accordingly the display quality is improved and the costs for disposing control circuit-chips is decreased.

Figure 3:
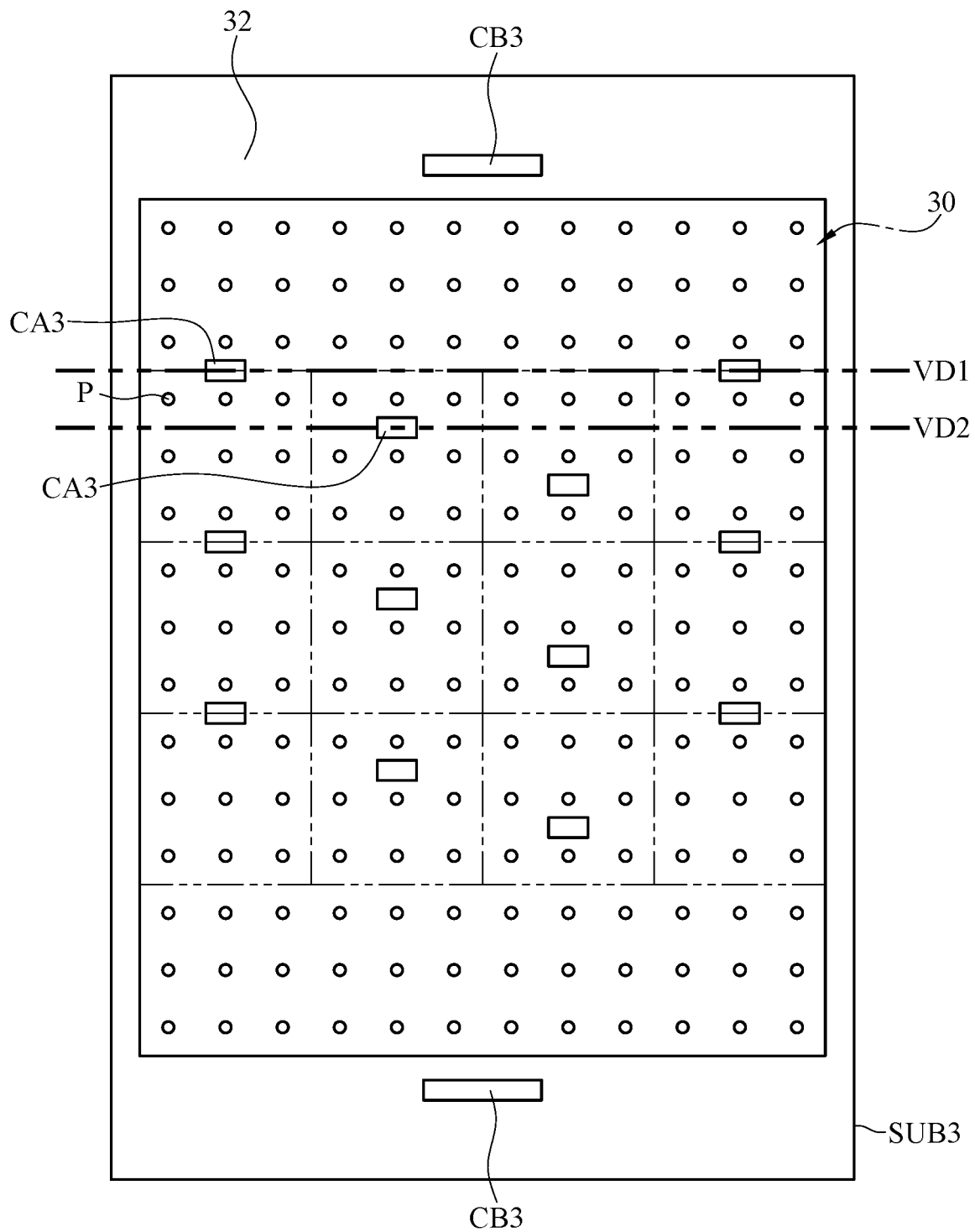
FIG. 3 is a diagram of a micro light-emitting diode display panel according to another embodiment of the present disclosure.

Please refer to FIG. 3, which is a diagram of a micro light-emitting diode display panel according to another embodiment of the present disclosure. The micro light-emitting diode display panel 3 of FIG. 3 includes a display area 30, a non-display area 32 adjacent to the display area 30, a plurality of micro light-emitting diodes P, a plurality of micro control elements CA3 and two control elements CB3. The micro light-emitting diode display panel 3 has a substrate SUB3, and the plurality of micro control elements CA3, the plurality of micro light-emitting diodes P and the two control elements CB3 are all disposed on the same side of the substrate SUB3. The micro light-emitting diode display panel 3 shown in the embodiment of FIG. 3 is similar to the micro light-emitting diode display panel 2 shown in the embodiment of FIG. 2. The difference lies in that the arrangement of the micro control elements CA3 in the display area 30 is different from the arrangement of the micro control elements CA2 in the display area 20. Specifically, in the micro light-emitting diode display panel 2 of FIG. 2. The plurality of micro control elements CA2 are disposed along the same straight line in the same direction in the display area 20. In the micro light-emitting diode display panel 3 of FIG. 3, each of the plurality of micro control elements CA3 and its adjacent micro control element CA3 are misaligned in the first direction D1 (horizontal direction). More specifically, the display area 30 has a first virtual straight line VD1 and a second virtual straight line VD2 both in parallel with the first direction D1. The second virtual straight line VD2 is spaced from the first virtual straight line VD1 in parallel. The first virtual straight line VD1 passes through a respective portion of the plurality of micro control elements CA3, and the second virtual straight line VD2 passes through a respective portion of the plurality of micro control elements CA3. The micro control element CA3 which the first virtual straight line VD1 passes through and the micro control element CA3 which the second virtual straight line VD2 passes through are used for respectively controlling the micro light-emitting diodes P located in the two adjacent sub-display areas A1. More specifically, different from the embodiment of FIG. 2 in which the plurality of micro control element CA2 are arranged in a linear manner, the adjacent micro control elements CA3 are misaligned in the first direction D1 (namely the horizontal direction) in the embodiment of FIG. 3. It is helpful to improve the display quality by taking such the arrangement.

More specifically, since the sizes of the micro control elements CA3 are larger than the sizes of the micro light-emitting diodes P, it is possible that an interference fringe occurs and a poor display quality is accordingly presented if the micro control elements CA3 and the micro light-emitting diodes P are all disposed in a linear arrangement in the display area 30. Therefore, in the micro light-emitting diode display panel 3 of FIG. 3, it is helpful to reduce the possibility of the occurrence of the interference fringe and improve the display quality by disposing the adjacent micro control elements CA3 in a misaligned arrangement along the same direction.

Figure 4A:
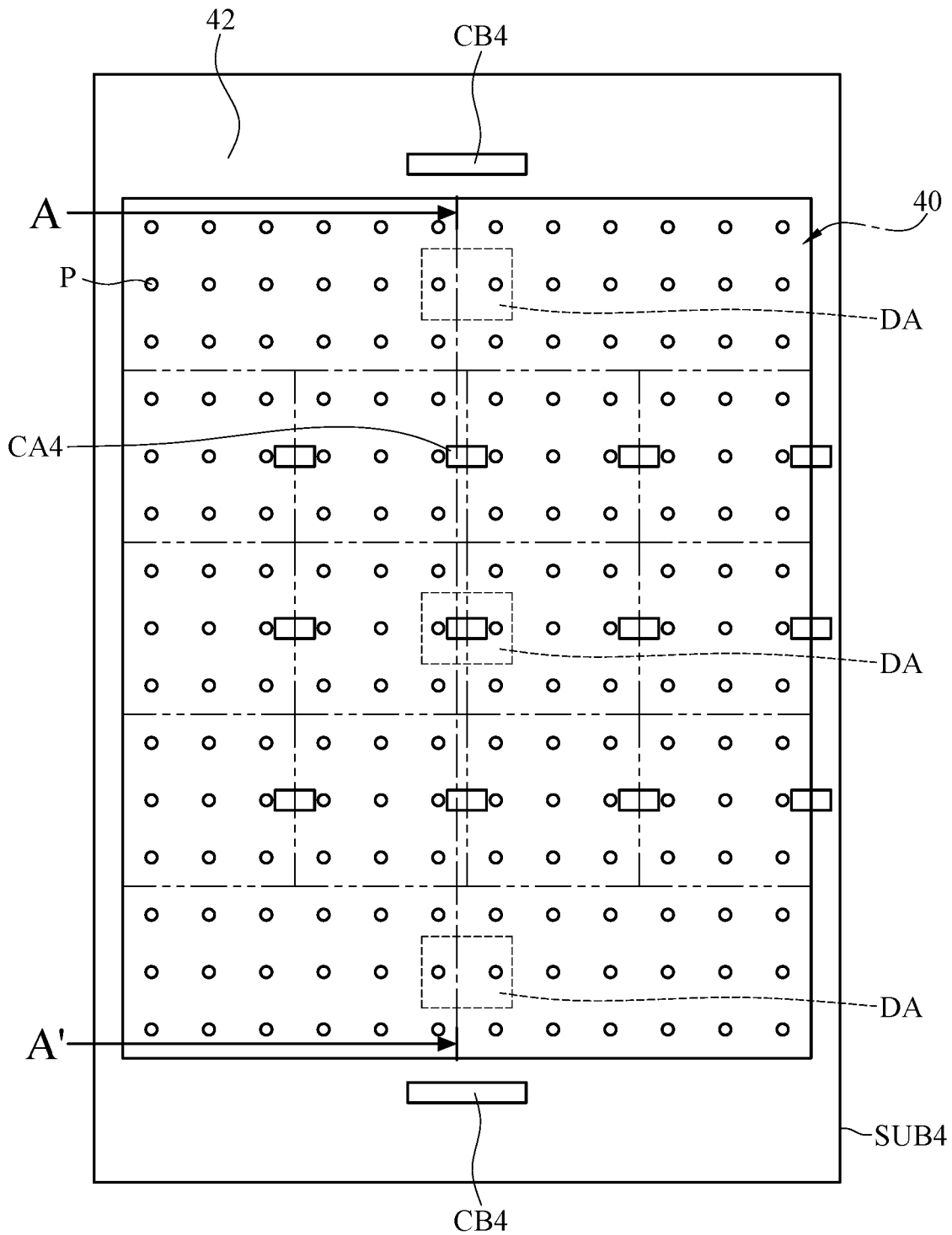
FIG. 4A is a diagram of a micro light-emitting diode display panel according to another embodiment of the present disclosure.
Figure 4B:
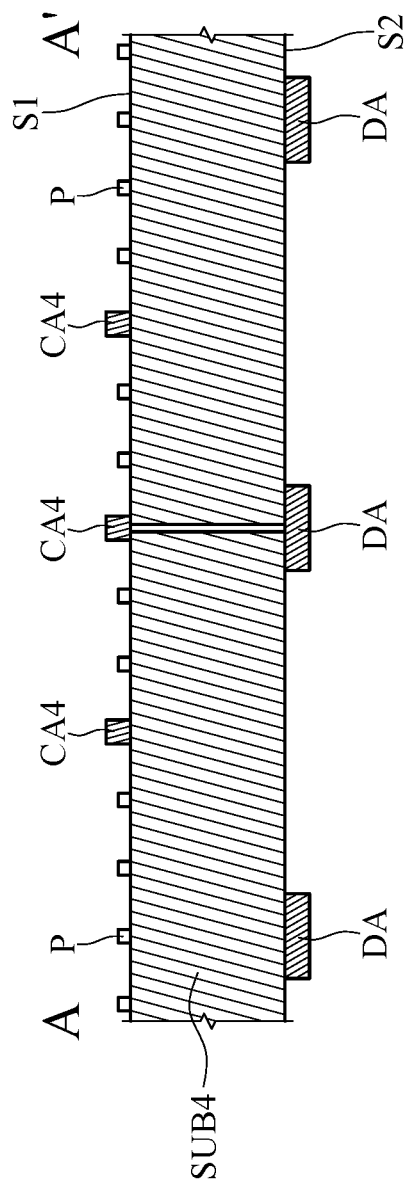
FIG. 4B is a cross-sectional view of the micro light-emitting diode display panel according to the embodiment of FIG. 4A.

Refer to FIG. 4A and FIG. 4B. FIG. 4A is a diagram of a micro light-emitting diode display panel 4 according to another embodiment of the present disclosure, whereas FIG. 4B is a cross-sectional view of the micro light-emitting diode display panel 4 shown in FIG. 4A. The micro light-emitting diode display panel 4 includes a substrate SUB4, a display area 40, a non-display area 42 next to the display area 40, a plurality of light-emitting diodes P, a plurality of micro control elements CA4, two control elements CB4 and at least one functional circuit DA. The substrate SUB4 has a first surface S1 and a second surface S2 opposite to the first surface S1. The micro light-emitting diodes P, the micro control elements CA4 and the control elements CB4 are disposed on the first surface S1, and the functional circuits DA are disposed on the second surface S2 and electrically connected to part or all of the micro control elements CA4. Basically, the micro light-emitting diode display panel 4 is similar to the micro light-emitting diode display panel 2 shown in FIG. 2. The difference lies in that the micro light-emitting diode display panel 4 further has the plurality of functional circuits DA disposed on the substrate SUB. In the embodiment, the plurality of micro control elements CA4 serve as LED driving devices for driving and controlling luminance of the micro light-emitting diodes P in the display area 40 while the functional circuits DA such as compensation circuits are adapted for compensation computations for image signals or for image compensation signals in different display modes. However, the present disclosure is not limited to the above embodiment. In practice, the functional circuit DA may be a gravity sensing circuit, a pressure sensing circuit, a light sensing circuit, or even a central processing circuit.

In general, in order to meet the demands of high efficiencies and high resolutions, the number of circuits required by a display panel increases accordingly. When the number of circuit increases, it is difficult to balance display qualities and needs for narrow bezel designs. To address the above problem, in the display panel 4 shown in the embodiments of FIG. 4A and FIG. 4B, the plurality of micro control elements CA4 and the plurality of micro light-emitting diodes P are disposed on one side of the substrate SUB4 (namely "the first surface S1") while the functional circuits DA are disposed on the other side of the substrate SUB4 (namely "the second surface S2"). Thereby, the number of circuit on the display side of the display panel (namely "the first surface S1") is decreased, and accordingly the demands for the high efficiencies and the high resolutions are met. Moreover, the display qualities and the needs for narrow bezel designs are balanced. In a real implementation, the plurality of micro control elements CA4 and the plurality of functional circuits DA are electrically connected together through via holes, side wirings or FPC of the substrate so as to transmit necessary signals.

In one embodiment, the substrate SUB4 is a flexible substrate. In the case in which a display panel is applied to a product having a non-rectangular display (e.g. the vehicle dashboard, the rounded watch surface, etc), the difficult of processing and cutting for a solid substrate could be avoided by using the flexible substrate as the substrate SUB4.

Figure 5A:
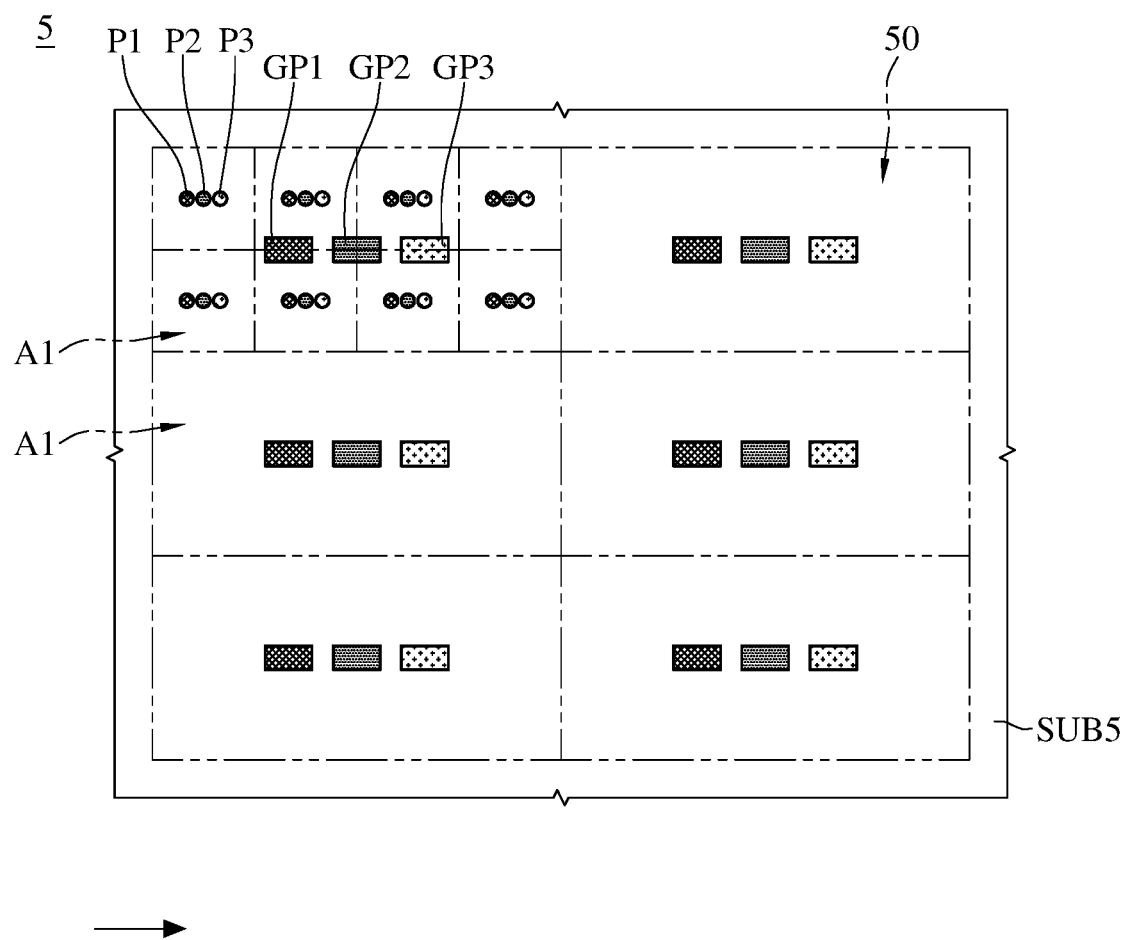
FIG. 5A is a diagram of a micro light-emitting diode display panel according to another embodiment of the present disclosure.
Figure 5B:
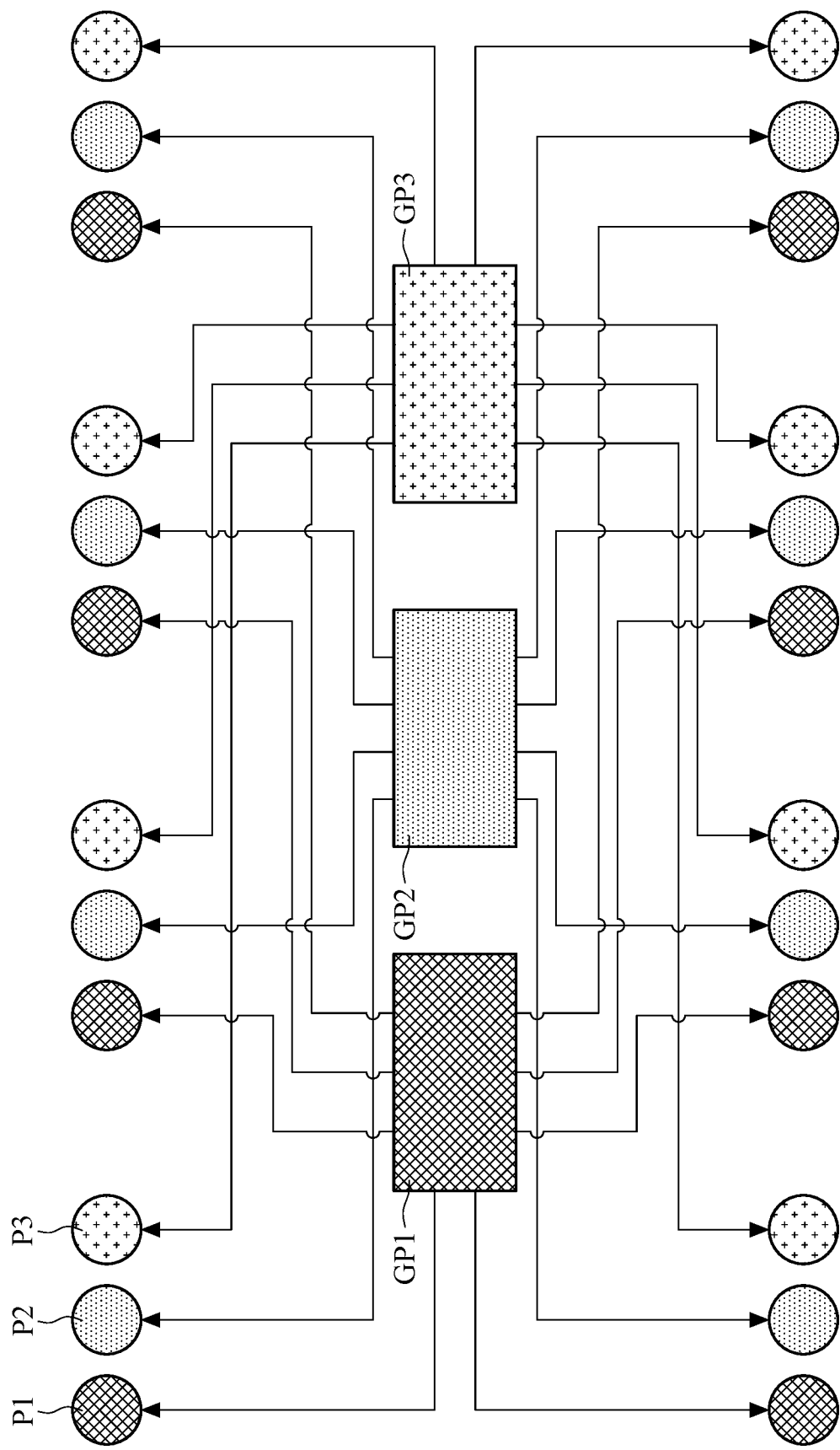
FIG. 5B is a diagram of circuit connections in a single sub-display area according to the embodiment of FIG. 5A.

Please refer to FIG. 5A to FIG. 5B. FIG. 5A is a diagram of a micro light-emitting diode display panel 5 according to one embodiment of the present disclosure. FIG. 5B is a diagram of circuit connections in a single sub-display area according to the embodiment of FIG. 5A. The micro light-emitting diode display panel 5 shown in the embodiment includes a substrate SUB5, a display area 50 divided into a plurality of sub-display areas A1, a plurality of micro light-emitting elements (e.g. P1, P2, P3) and a plurality of micro control elements (e.g. GP1, GP2, GP3). The plurality of micro light-emitting elements and the plurality of micro control elements are all disposed in the display area 50 and on the same side of the substrate SUB5. The plurality of micro light-emitting elements includes a plurality of first color micro light-emitting diodes P1, a plurality of second color micro light-emitting diodes P2 and a plurality of third color micro light-emitting diodes P3, wherein wavelength of the first color micro light-emitting diodes P1, wavelength of the second color micro light-emitting diodes P2 and wavelength of the third color micro light-emitting diodes P3 are different from one other. The plurality of micro control elements includes a plurality of first color micro circuit-chips GP1, a plurality of second color micro circuit-chips GP2 and a plurality of third color micro circuit-chips GP3. Each of the plurality of first color micro circuit-chips GP1 is electrically connected to and controls a respective part of the plurality of first color micro light-emitting diodes P1, each of the plurality of second color micro circuit-chips GP2 is electrically connected to and controls a respective part of the plurality of second color micro light-emitting diodes P2, and each of the plurality of third color micro circuit-chips GP3 is electrically connected to and controls a respective part of the plurality of third color micro light-emitting diodes P3. In the embodiment, in a single sub-display area A1, one of the micro control elements (e.g. GP1), serves as an example, controls eight micro light-emitting elements (e.g. P1) which emits the same color light. In an example, the first color micro light-emitting diodes P1 are red micro light-emitting diodes, the second color micro light-emitting diodes P2 are green micro light-emitting diodes, and the third color micro light-emitting diodes P3 are blue micro light-emitting diodes. For the purpose of simplification for drawings, only part of the micro light-emitting diodes and the micro circuit-chips are labeled instead of labeling all of the light-emitting diodes and the micro circuits.

FIG. 5B only shows a diagram of circuit connections of one single sub-display area A1. The rest of the sub-display areas have the same circuit connections as the sub-display area shown in FIG. 5B, so no more repeated here. In FIGS. 5A, 5B, different color micro circuit-chips GP1/GP2/GP3 are distinguished based on different filled-patterns. In other embodiments, the plurality of micro light-emitting diodes may include a plurality of first color micro light-emitting diodes P1 and a plurality of second color micro light-emitting diodes P2 only, and the plurality of micro control elements may include a plurality of first color micro circuit-chips GP1 and a plurality of second color micro circuit-chips GP2; or may further include a plurality of fourth color micro light-emitting diodes and a plurality of fourth color micro circuit-chips. Each of the plurality of the first color micro circuit-chips GP1 is electrically connected to and controls the first color micro light-emitting diodes P in each sub-display area A1, each of the second color micro circuit-chips GP2 is electrically connected to and controls the second color micro light-emitting diodes P2 in each sub-display area A1. In addition, the red micro light-emitting diodes, and the blue micro light-emitting diodes and the green micro light-emitting diodes used in the embodiment are fabricated using different epitaxy material. In other embodiments, light-conversion materials (e.g. phosphor, quantum-dots, and color filter, etc) can be used for forming required colors in different sub-pixel.

In practice, operating voltages and currents required by different color micro light-emitting diodes are not all the same, as a result, the power consumptions of the micro circuit-chips remain high. For example, in an embodiment, the ratio of the operating voltages required by the red, the green and the blue micro light-emitting diodes is approximately 1:1.35:1.5, and the ratio of currents per unit of time required by the red, the green and the blue micro light-emitting diodes is approximately 1:5:6. More specifically, in one embodiment, the red, the green and the blue micro light-emitting diodes requires the operating voltages of 1.5-1.8V, 2.2-2.4V and 2.4-2.6V respectively. In another embodiment, the current input per unit of time required by the red micro light-emitting diode would be 0.1-0.5 times of the current input per unit of time required by the blue or the green micro light-emitting diodes.

In this embodiment, a specific color micro circuit-chip is used for controlling the respective color light-emitting diodes in each of the sub-display areas, so that the power consumptions of circuit-chips are reduced and accordingly the overall operation efficiency of the display panel is improved.

Figure 6:
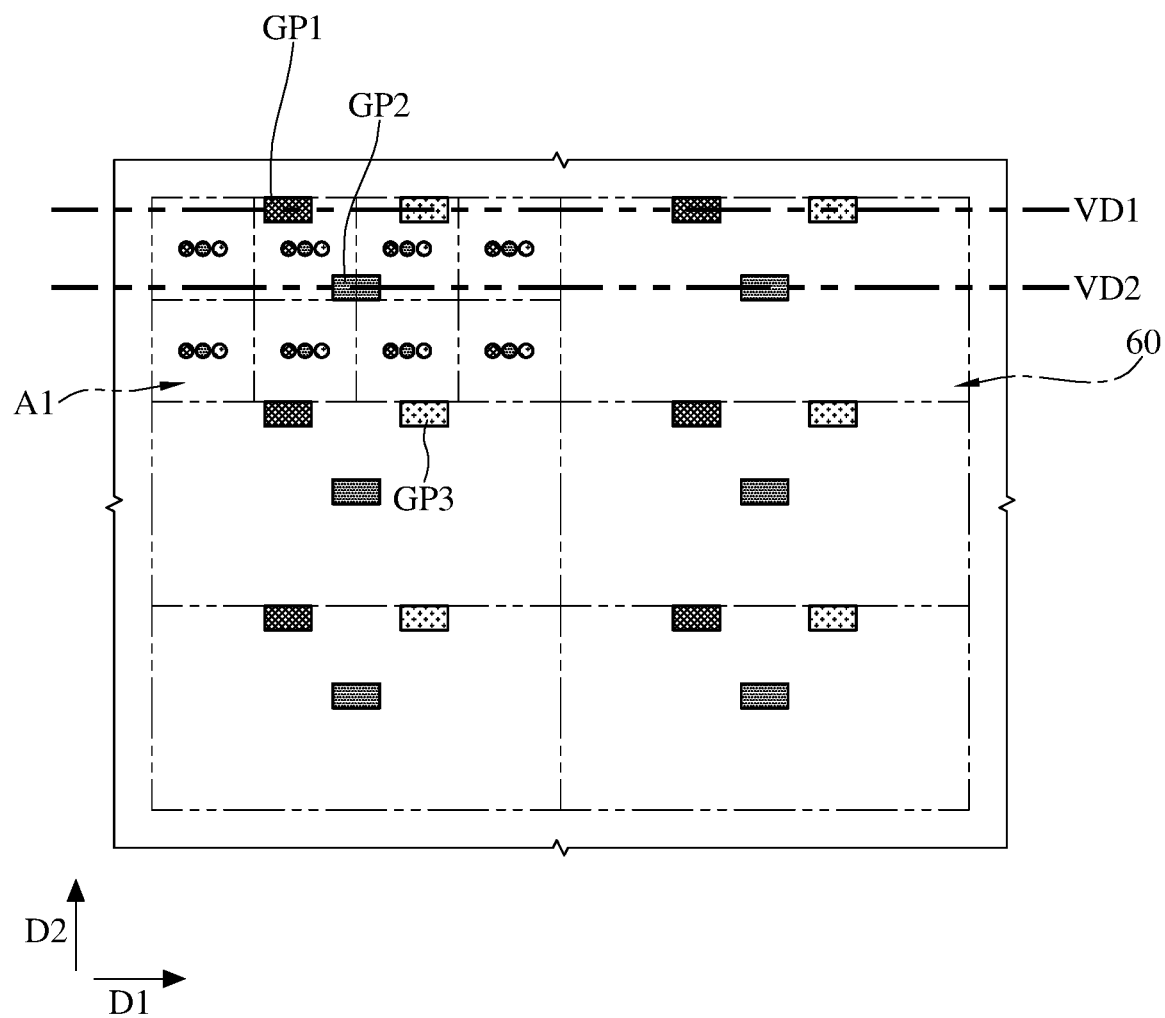
FIG. 6 is a diagram of a micro light-emitting diode display panel according to another embodiment of the present disclosure.

Please refer to FIG. 6, which is a diagram of a micro light-emitting diode display panel according to another embodiment of the present disclosure. A micro light-emitting diode display panel 6 of the embodiment of FIG. 6 is similar to the micro light-emitting diode display panel 5 of the embodiment of FIG. 5A. The difference lies in the arrangement of the first color micro circuit-chips GP1, the second color micro circuit-chips GP2 and the third color micro circuit-chips GP3 in a display area 60. In the micro light-emitting diode display panel 5 shown in the embodiment of FIG. 5A, the first color micro circuit-chips GP1, the second color micro circuit-chips GP2 and the third color micro circuit-chips GP3 are disposed in an arrangement of horizontal straight line. In other words, the micro control elements in a sub-display area A1 are all disposed in a straight line along the direction D1.

In the embodiment of FIG. 6, the first color micro circuit-chips GP1, the second color micro circuit-chips GP2 and the third color micro circuit-chips GP3 are not disposed in an arrangement of horizontal straight line. Specifically, each of the sub-display areas A1 has a first virtual straight line VD1 and a second virtual straight line VD2 both parallel with the first direction D1, and the first virtual straight line VD1 is parallel to and spaced from the second virtual straight line VD2. The first virtual straight line VD1 passes through the first color micro circuit-chips GP1 and the third color micro circuit-chips GP3 while the second virtual straight line VD2 passes through the second color micro circuit-chips GP2. Such an arrangement results in reduction of generations of uniform interference fringes and improves the display quality.

More specifically, in this embodiment, the first color micro circuit-chips GP1 and the third color micro circuit-chips GP3 are arranged in the same straight line extending along the first direction D1 while the second color micro circuit-chips GP2 are misaligned with the first color micro circuit-chips GP1 and the third color micro circuit-chips GP3 in the first direction D1. The first color micro circuit-chips GP1, the second color micro circuit-chips GP2 and the third color micro circuit-chips GP3 are arranged in different straight line extending along the second direction D2. By taking the advantages of such an arrangement, the uniform interference fringes occurring can be reduced and accordingly the display quality is further improved.

Figure 7:
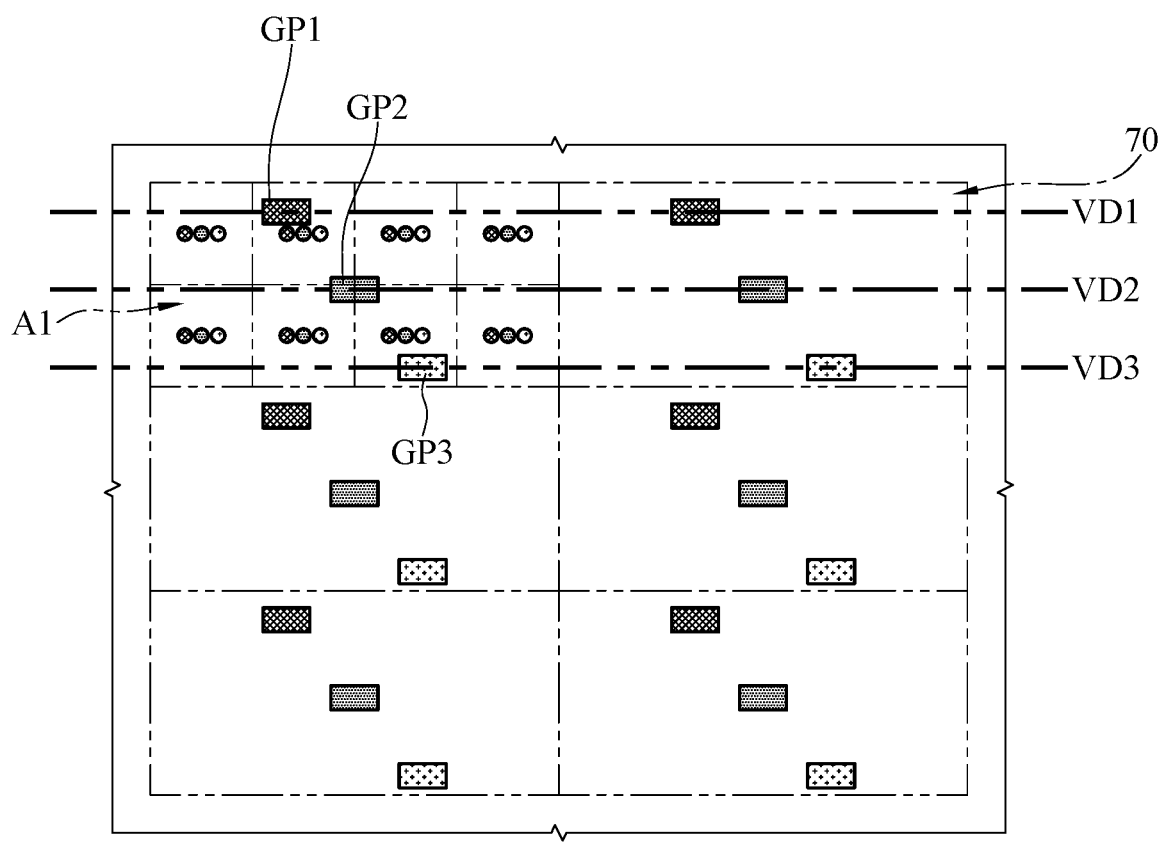
FIG. 7 is a diagram of a micro light-emitting diode display panel according to another embodiment of the present disclosure.

Please refer to FIG. 7, which is a diagram of a micro light-emitting diode display panel 7 according to another embodiment of the present disclosure. The micro light-emitting diode display panel 7 shown in the embodiment of FIG. 7 basically has the same structure as the micro light-emitting diode display panel 6 shown in the aforementioned embodiment. The difference lies in the arrangement of a first color micro circuit-chip GP1, a second color micro circuit-chip GP2 and a third color micro circuit-chip GP3 in each of the sub-display areas A1. In the micro light-emitting diode display panel 7 shown in the embodiment, the first color micro circuit-chip GP1, the second color micro circuit-chip GP2 and the third color micro circuit-chip GP3 are misaligned in the first direction D1 (namely the horizontal direction) in each sub-display area A1. Each of the sub-display areas A1 has the first virtual straight line VD1, the second virtual straight line VD2 and the third virtual straight line VD3, with all of them are parallel to the first direction D1 and spaced from one another. The first virtual straight line VD1 passes through the respective first color micro circuit-chip GP1, the second virtual straight line VD2 passes through the respective second color micro circuit-chip GP2 and, the third virtual straight line VD3 passes through the respective third color micro circuit-chip GP3.

In practice, the sizes of micro circuit-chips are significantly greater than the sizes of the micro light-emitting diodes. For example, each micro circuit-chip has the height of 50-200 μm approximately while each micro light-emitting diode has the height of 3-15 μm approximately. If those color control circuit-chips are disposed in a linear arrangement, the uniform interference fringes may occur in the display panel and accordingly the quality of views would be downgraded. By taking the advantages of the misaligned arrangement in which the first color micro circuit-chips, the second color micro circuit-chips and the third color micro circuit-chips are respectively disposed in the first virtual straight line VD1, the second virtual straight line VD2 and the third virtual straight line VD3 all parallel to the first direction D1, the occurrences of the uniform interference fringes are decreased and the display quality is improved accordingly.

In another embodiment, the first color micro circuit-chip GP1, the second color micro circuit-chip GP2 and the third color micro circuit-chip GP3 are arranged in a L-shaped manner in each of the sub-display areas A1. As a result, the occurrences of the uniform interference fringes are decreased and the display quality is improved accordingly.

Figure 8:
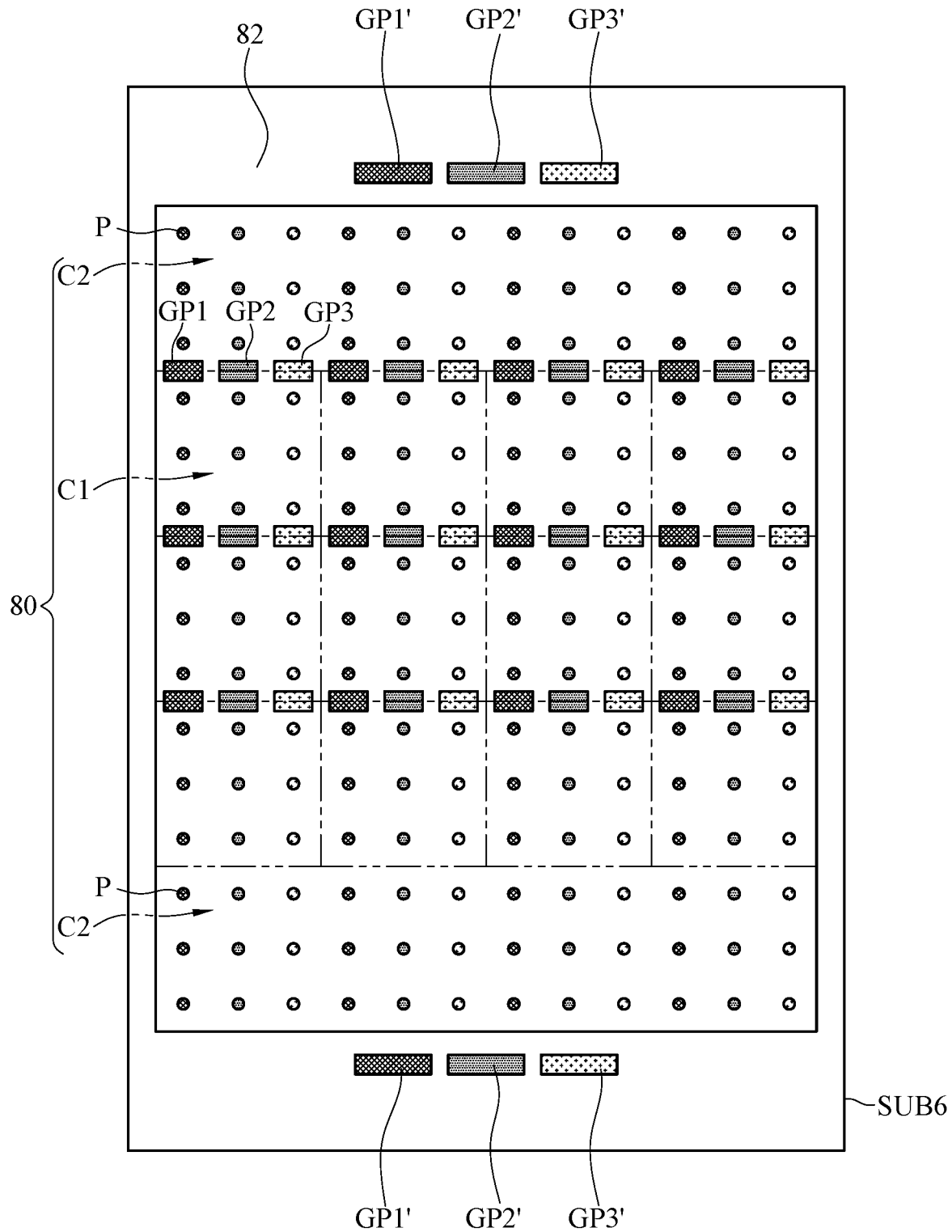
FIG. 8 is a diagram of a micro light-emitting diode display panel according to another embodiment of the present disclosure.

Please refer to FIG. 8, which is a diagram of a micro light-emitting diode display panel according to another embodiment of the present disclosure. The micro light-emitting diode display panel 8 of FIG. 8 includes a display area 80, a non-display area 82, a plurality of micro control elements (e.g. GP1-GP3), a plurality of micro light-emitting elements P, a plurality of control elements (e.g. GP1'-GP3') and a substrate SUB6. Specifically, the display area 80 is divided into a plurality of sub-display areas C1 and two sub-display areas C2 adjacent to the non-display area 82, and the non-display area 82 surrounds the display area 80. The plurality of micro control elements GP1-GP3, the plurality of micro light-emitting elements P and the plurality of control elements GP1'-GP3' are located on the same side of the substrate SUB6. The number of the micro light-emitting elements P located in each of the sub-display areas C2 is greater than the number of the micro light-emitting elements P located in each of the sub-display areas C1. The sub-display areas C1 and C2 do not overlap each other. The micro light-emitting elements P comprise a plurality of first color micro light-emitting diodes, a plurality of second color micro light-emitting diodes and a plurality of third color micro light-emitting diodes. In this embodiment, the first color micro light-emitting diodes are red micro light-emitting diodes, the second color micro light-emitting diodes are green micro light-emitting diodes and the third color micro light-emitting diodes are blue micro light-emitting diodes.

The plurality of micro control elements includes the first color micro circuit-chips GP1, the second color micro circuit-chips GP2 and the third color micro circuit-chips GP3 disposed in the display area 80, and are electrically connected to and control the micro light-emitting elements P in a respective one of sub-display areas C1. Each of the first color micro circuit-chips GP1 is electrically connected to and controls the first color micro light-emitting diodes among the micro light-emitting elements P in one of the sub-display areas C1, each of the second color micro circuit-chips GP2 is electrically connected to and control the second color light-emitting diodes in one of the sub-display areas C1, each of the third color micro circuit-chips GP3 is electrically connected to and controls the third light-emitting diodes in one of the sub-display areas C1. The plurality of control elements includes the first color circuit-chips GP1', the second color circuit-chips GP2' and the third color circuit-chips GP3' disposed in the non-display area 82. Each of the first color circuit-chip s GP1' is electrically connected to and controls the first color light-emitting diodes in one of the sub-display areas C2, each of the second color circuit-chip s GP2' is electrically connected to and controls the second color light-emitting diodes in one of the sub-display areas C2, and each of the third color circuit-chips GP3' is electrically connected to and controls the third color light-emitting diodes in one of the sub-display areas C2. In other words, the first color micro circuit-chips GP1 and the first color circuit-chips GP1' are only control the first color micro light-emitting diodes in respective sub-display areas C1 and C2, the second color micro circuit-chips GP2 and the second color circuit-chips GP2' are only control the second color micro light-emitting diodes and the third color micro circuit-chips GP3 and the third color circuit-chips GP3' are only control the third color micro light-emitting diodes.

In this embodiment, the first color is red, the second color is green, and the third color is blue. In this embodiment, the number of the micro light-emitting elements P controlled by each of the color circuit-chips GP1', GP2' and GP3' is greater than the number of the micro light-emitting elements P controlled by each of the color micro circuit-chips GP1, GP2 and GP3. The detailed descriptions regarding the light-emitting diodes have been introduced in the embodiments of FIG. 5A and FIG. 5B, so no more repeated here.

In practice, the number of the micro light-emitting elements P controlled by each of the color circui-chips (e.g. GP1'-GP3') is at least twice but less than ten times of the number of the micro light-emitting elements P controlled by each of the color micro circuit-chips (e.g. GP1-GP3). Since the sizes and the pin number of each control element disposed in the non-display area 82 are greater than the sizes and the pin number of each micro control element in the display area 80, the arrangement in which the control elements are disposed in the non-display area would be helpful to reduce the number of the micro control elements needed to be disposed in the display area by taking the advantages of the sizes and the number of pins of the control elements. By disposing the control element in the non-display area to control more light-emitting diodes P in the sub-display area C2, the number of the micro control elements GP1, GP2 and GP3 to be disposed is decreased. Accordingly, the display quality is improved and the costs for arranging control circuit-chips or circuit layout are reduced. In this embodiment, the display area 80 is rectangular. In another embodiment, the display area 80 can be non-rectangular, and can be designed in any kind of shapes according to actual demands. By taking the advantages of the control element having more pins, it is possible to integrate the number of the light-emitting diodes P disposed asymmetrically on the edges.

Figure 9:
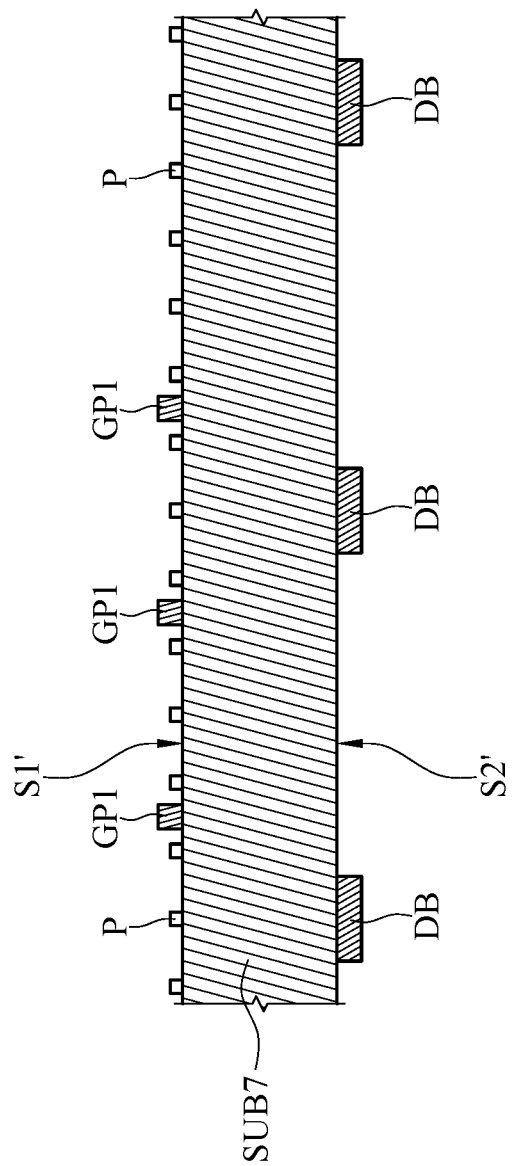
FIG. 9 is a cross-sectional view of a micro light-emitting diode display panel according to one embodiment of the present disclosure.

Please refer to FIG. 9, which is a cross-sectional view of a micro light-emitting diode display panel according to one embodiment of the present disclosure. As shown in FIG. 9, the micro light-emitting diode display panel 9 basically has the same structure as the micro light-emitting diode display panel 8 shown in the embodiment of FIG. 8. In this embodiment, the micro light-emitting diode display panel 9 includes a substrate SUB7 and a plurality of functional circuits DB. The substrate SUB7 has a first surface S1' and a second surface S2' opposite to the first surface S1'. The micro control elements (e.g. the first, the second and the third color micro circuit-chips GP1-GP3), the control elements (e.g. the first, the second and the third color circuit-chips GP1'-GP3') and the micro light-emitting elements P are disposed on the first surface S1' while the plurality of functional circuits DB are disposed on the second surface S2' electrically connected to at least one of the micro control elements.

In practice, the functional circuits DB could be compensation circuits adapted to compensate for image signals or image compensation signals in different display modes. However, the present disclosure is not limited to the above example. The functional circuits DB may be a gravity sensing circuits, pressure sensing circuits, light sensing circuits, or even central processing circuits of the micro light-emitting diode display panel.

In conclusion, in the display panel disclosed in the present disclosure, some of the control elements are disposed in the non-display area of the display panel so as to control more light-emitting diodes by taking the advantages of the sizes and the number of pins. Moreover, based on the features of color-light controlling, each of the color control elements is capable of controlling its own respective light-emitting diodes to emit respective color lights. Thereby, the matching of the control circuits and the light-emitting diodes can be significantly improved and accordingly the display quality and the performance of the display panel are improved.

What is claimed is:

1. A micro light-emitting diode display panel, comprising:
a display area;
a plurality of micro light-emitting elements disposed in the display area and comprising a plurality of first color micro light-emitting diodes and a plurality of second color micro light-emitting diodes, with a light wavelength of each of the plurality of first color micro light-emitting diodes different from a light wavelength of each of the plurality of second color micro light-emitting diodes;
a plurality of micro control elements disposed in the display area and comprising a plurality of first color micro circuit-chips and a plurality of second color micro circuit-chips, wherein one of the plurality of first color micro circuit-chips electrically connects to and controls at least two of the plurality of first color micro light-emitting diodes, and one of the plurality of second color micro circuit-chips electrically connects to and controls at least two of the plurality of second color micro light-emitting diodes;
a non-display area adjacent to the display area; and
at least one control element disposed in the non-display area and having a first color circuit-chip and a second color circuit-chip, wherein the first color circuit-chip electrically connects to and controls a part of the plurality of first color micro light-emitting diodes, and the second color circuit-chip electrically connects to and controls a part of the plurality of second color micro light-emitting diodes, and
wherein a number of the micro light-emitting elements controlled by the first color circuit-chip and the second color circuit-chip respectively are greater than a number of the plurality of micro light-emitting elements controlled by each of the first color micro circuit-chips and each of the second color micro circuit-chips respectively.

2. The micro light-emitting diode display panel according to claim 1, wherein the plurality of micro light-emitting elements further comprises a plurality of third color micro light-emitting diodes, a light wavelength of each of the plurality of third color micro light-emitting diodes is different from the light wavelength of each of the plurality of second color micro light-emitting diodes and the light wavelength of each of the plurality of first color micro light-emitting diodes, the plurality of micro control elements further comprises a plurality of third color micro circuit-chips, and the plurality of third color micro circuit-chips electrically connect to and control the plurality of third color micro light-emitting diodes.

3. The micro light-emitting diode display panel according to claim 1, wherein the display area is divided into a plurality of sub-display areas, one of the plurality of first color micro circuit-chips and one of the plurality of second color micro circuit-chips are disposed in one of the plurality of sub-display areas, and the plurality of first color micro circuit-chips and the plurality of second color micro circuit-chips are arranged in a staggered arrangement in a first direction.

4. The micro light-emitting diode display panel according to claim 3, wherein each of plurality of sub-display areas further comprises a first virtual straight line and a second virtual straight line parallel to and spaced from the first virtual straight line, the first virtual straight line passes through the first color micro circuit-chip, and the second virtual straight line passes through the second color micro circuit-chip.

5. The micro light-emitting diode display panel according to claim 1, further comprising:
a substrate having a first surface and a second surface opposite to the first surface, with the plurality of micro control elements and the plurality of micro light-emitting elements disposed on the first surface.

6. The micro light-emitting diode display panel according to claim 5, further comprising:
at least one functional circuit disposed on the second surface and electrically connected to the plurality of micro control elements.

7. The micro light-emitting diode display panel according to claim 5, wherein the substrate is a flexible substrate.

8. A micro light-emitting diode display panel, comprising:
a display area;
a plurality of micro light-emitting diodes disposed in the display area;
a plurality of micro control elements disposed in the display area, wherein each of the plurality of micro control elements electrically connects to and controls a part of the plurality of micro light-emitting diodes;
a non-display area next to the display area; and
at least one control element disposed in the non-display area and electrically connected to and controlling another part of the plurality of micro light-emitting diodes,
wherein a number of the micro light-emitting diodes controlled by the at least one control element is greater than a number of the micro light-emitting diodes controlled by each of the plurality of micro control elements.

9. The micro light-emitting diode display panel according to claim 8, wherein the display area further has a first virtual straight line and a second virtual straight line both parallel to a first direction, the second virtual straight line is spaced from the first virtual straight line, and any two of the plurality of micro light-emitting diodes, adjacent to each other, are disposed on the first virtual straight line and the second virtual straight line extending along the first direction respectively.

10. The micro light-emitting diode display panel according to claim 8, further comprising:
a substrate having a first surface and a second surface opposite to the first surface, wherein the plurality of micro control elements and the plurality of micro light-emitting diodes are disposed on the first surface; and
a plurality of functional circuit disposed on the second surface and electrically connected to the plurality of micro control elements.

11. The micro light-emitting diode display panel according to claim 10, wherein the substrate is a flexible substrate.

12. The micro light-emitting diode display panel according to claim 8, wherein the display area is non-rectangular.

\* \* \* \* \*